United States Patent
Oh et al.

(10) Patent No.: US 6,977,431 B1
(45) Date of Patent: Dec. 20, 2005

(54) STACKABLE SEMICONDUCTOR PACKAGE AND MANUFACTURING METHOD THEREOF

(75) Inventors: Kwang Seok Oh, Seoul (KR); Doo Hwan Moon, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/702,274

(22) Filed: Nov. 5, 2003

(51) Int. Cl.$^7$ ............... H01L 23/28; H01L 23/02; H01L 23/48; H01L 23/06
(52) U.S. Cl. ............ 257/696; 257/666; 257/678; 257/787; 257/684; 257/796; 257/698; 257/691; 257/676; 257/773; 257/775; 257/776; 257/784; 257/786
(58) Field of Search ............ 257/694, 796, 257/675, 687, 696, 698, 691, 784, 692, 786, 257/666, 676, 712, 713, 717, 776, 693, 775, 257/773

(56) References Cited

U.S. PATENT DOCUMENTS

| | | |
|---|---|---|
| 3,838,984 A | 10/1974 | Crane et al. |
| 4,159,221 A | 6/1979 | Schuessler |
| 4,398,235 A | 8/1983 | Lutz et al. |
| 4,833,568 A | 5/1989 | Berhold |
| 4,956,694 A | 9/1990 | Eide |
| 4,996,587 A | 2/1991 | Hinrichsmeyer et al. |
| 5,068,713 A | 11/1991 | Toda |
| 5,230,759 A | 7/1993 | Hiraiwa |
| 5,258,094 A | 11/1993 | Furui et al. |
| 5,266,834 A | 11/1993 | Nishi et al. |
| 5,332,864 A | 7/1994 | Liang et al. |
| 5,381,039 A | 1/1995 | Morrison |
| 5,381,047 A | 1/1995 | Kanno |
| 5,394,010 A | 2/1995 | Tazawa et al. |
| 5,414,300 A | 5/1995 | Tozawa et al. |
| 5,435,057 A | 7/1995 | Bindra et al. |
| 5,455,387 A | 10/1995 | Hoffman et al. |
| 5,521,429 A | 5/1996 | Aono et al. |
| 5,581,118 A * | 12/1996 | Mays .................. 257/666 |
| 5,587,341 A | 12/1996 | Masayuki et al. |
| 5,594,275 A | 1/1997 | Kwon et al. |
| 5,625,221 A | 4/1997 | Kim et al. |
| 5,677,569 A | 10/1997 | Choi et al. |
| 5,715,147 A | 2/1998 | Nagano |
| 5,742,007 A | 4/1998 | Kornowski et al. |
| 5,760,471 A | 6/1998 | Fujisawa et al. |
| 5,835,988 A * | 11/1998 | Ishii .................. 257/684 |

(Continued)

FOREIGN PATENT DOCUMENTS

EP 0948048 A1 10/1999

(Continued)

*Primary Examiner*—Alexander Oscar Williams
(74) *Attorney, Agent, or Firm*—Gunnison, McKay & Hodgson, L.L.P.; Serge J. Hodgson

(57) ABSTRACT

A stackable semiconductor package is disclosed that includes a semiconductor die coupled to a metal leadframe. The semiconductor die is coupled to a die pad and is electrically coupled to leads of the leadframe. The semiconductor die, the die pad, and an inner lead portion of each of the leads is embedded in an encapsulant, and an outer lead portion of each of the leads is free of the encapsulant. A surface of the die pad and of the inner lead portion of each of the leads is exposed in a plane with an exterior first surface of the encapsulant. The outer lead portion is vertically such that a mounting surface of the outer lead portion is provided below an opposite second surface of the encapsulant. Other semiconductor packages or electronic devices may be stacked on and electrically coupled to the exposed surface of the inner lead portions.

24 Claims, 16 Drawing Sheets

U.S. PATENT DOCUMENTS

| | | |
|---|---|---|
| 5,852,320 A | 12/1998 | Ichihashi |
| 5,859,471 A | 1/1999 | Kuraishi et al. |
| 5,877,043 A | 3/1999 | Alcoe et al. |
| 5,880,403 A | 3/1999 | Czajkowski et al. |
| 5,950,074 A | 9/1999 | Glenn et al. |
| 5,962,810 A | 10/1999 | Glenn |
| 5,977,613 A | 11/1999 | Takata et al. |
| 5,986,209 A | 11/1999 | Tandy |
| 6,114,221 A | 9/2000 | Tonti et al. |
| 6,130,115 A | 10/2000 | Okumura et al. |
| 6,143,981 A * | 11/2000 | Glenn ................. 174/52.4 |
| 6,180,881 B1 | 1/2001 | Isaak |
| 6,225,146 B1 | 5/2001 | Yamaguchi et al. |
| 6,235,554 B1 | 5/2001 | Akram et al. |
| 6,242,281 B1 | 6/2001 | Mclellan et al. |
| 6,281,568 B1 | 8/2001 | Glenn et al. |
| 6,320,251 B1 * | 11/2001 | Glenn ................... 257/678 |
| 6,356,453 B1 | 3/2002 | Juskey et al. |
| 6,404,046 B1 | 6/2002 | Glenn et al. |
| 6,433,418 B1 * | 8/2002 | Fujisawa et al. ........... 257/696 |
| 6,459,148 B1 | 10/2002 | Chun-Jen et al. |
| 6,518,659 B1 * | 2/2003 | Glenn ................... 257/704 |
| 6,564,454 B1 | 5/2003 | Glenn et al. |
| 6,577,013 B1 | 6/2003 | Glenn et al. |
| 6,646,339 B1 * | 11/2003 | Ku et al. .................. 257/708 |
| 6,730,544 B1 * | 5/2004 | Yang ........................ 438/110 |
| 2004/0036180 A1 * | 2/2004 | Ho et al. .................. 257/778 |

FOREIGN PATENT DOCUMENTS

| | | | |
|---|---|---|---|
| JP | 63-33854 | 2/1988 | |
| JP | 63-188964 | 8/1988 | |
| JP | 63-289951 | 11/1988 | |
| JP | 64-1269 | 1/1989 | |
| JP | 1-106456 | 4/1989 | |
| JP | 2-129948 | 5/1990 | |
| JP | 402239651 A | 9/1990 | |
| JP | 3-69248 | 7/1991 | |
| JP | 3-171658 * | 7/1991 | ................. 29/827 |
| JP | 6-92076 | 4/1994 | |
| JP | 8-83858 | 3/1996 | |
| JP | 2003-7954 * | 1/2003 | |
| KR | 2000-0086253 | 12/2000 | |
| WO | WO 99/65282 A1 | 12/1999 | |

* cited by examiner

STACKABLE SEMICONDUCTOR PACKAGE AND MANUFACTURING METHOD THEREOF

BACKGROUND OF THE INVENTION

1. Field of the Invention

The field of the present invention is semiconductor packaging.

2. Description of the Related Art

Semiconductor packages commonly include a metal leadframe, which serves a base for the semiconductor package. Typically, the leadframe includes a central die pad, and a plurality of leads surrounding the die pad. One semiconductor die, or a plurality of stacked semiconductor dies, are coupled to the leadframe. Bond wires electrically couple bond pads of the semiconductor die(s) to the leads. A body of a plastic encapsulant encases the semiconductor die(s), an inner subportion of the length of the leads, and the bond wires. An outer subportion of the length of the leads extends from the encapsulant, allowing the leads to be electrically coupled to an external printed circuit board. Typically, leadframes are formed by mechanically stamping or chemically etching a continuous metal strip, which is made of copper (Cu), iron (Fe) or copper alloy (Cu Alloy), or its equivalent.

Packages including a stack of semiconductor dies are becoming popular, because more functions may be incorporated into a single package, without increasing the amount of space needed for mounting the package on the external printed circuit board. One difficulty associated with such packages is that, when stacking the semiconductor dies one on top of the other, adhesive used to couple the semiconductor dies together can contaminate the bond pads of the bottom semiconductor die. An alternative process wherein the two semiconductor dies are stacked on opposite sides of the die pad, i.e., with the die pad between them, avoids the contamination problem, but makes it difficult to handle the leadframe during manufacturing.

BRIEF SUMMARY OF THE INVENTION

The present invention includes stackable semiconductor packages, stacks of semiconductor packages, stacks of a semiconductor package and other types of electronic or passive devices, and methods of making such semiconductor packages and stacks, among other things. The stackable nature of the semiconductor packages allows for increased functionality, without increasing an amount of area consumed on a printed circuit board to which a stack including the semiconductor package is coupled.

An exemplary stackable first semiconductor package includes a metal die pad and a plurality of metal leads each radiating away from the die pad. The die pad and the respective leads each have a first surface, an opposite second surface, and peripheral side surfaces between the first and second surfaces. A semiconductor die is coupled to the second surface of the die pad and is electrically coupled to the second surface of the leads. The semiconductor die is encased in a body of a plastic encapsulant. The encapsulant covers the second surface and peripheral side surfaces of the die pad. A lengthwise inner lead portion of each of the leads is embedded in the encapsulant, while a lengthwise outer lead portion of each of the leads extends outwardly from a peripheral side of the encapsulant. The encapsulant covers the second surface and peripheral side surfaces of the inner lead portion of each of the leads. The first surface of the die pad and of the inner lead portion of each of the leads is exposed in common plane with an exterior first surface of the encapsulant. The outer lead portion of each of the leads includes vertical bends. A lowermost surface of the outer lead portion of each of the leads is approximately parallel to, but slightly below, the second surface of the encapsulant.

A second semiconductor package, or some other electronic device, can be stacked on over the first surfaces of the die pad and the inner lead portions. The input/output terminals of the second semiconductor package or electronic device may be electrically coupled to the exposed first surface of the inner lead portion of respective ones of the leads of the first semiconductor package.

The present invention is best understood by reference to the following detailed description when read in conjunction with the accompanying drawings.

BRIEF DESCRIPTION OF THE DRAWINGS

Common reference numerals are used throughout the drawings and the detailed description to indicate like elements.

DETAILED DESCRIPTION

The text herein and the accompanying drawings include descriptions and illustrations of exemplary embodiments of the present invention, including inventive semiconductor packages and stacks of semiconductor packages. Many of the embodiments have common features. Accordingly, redundant details are omitted when possible for the reader's convenience, with focus provided on the differences between the embodiments.

Figure 1A:
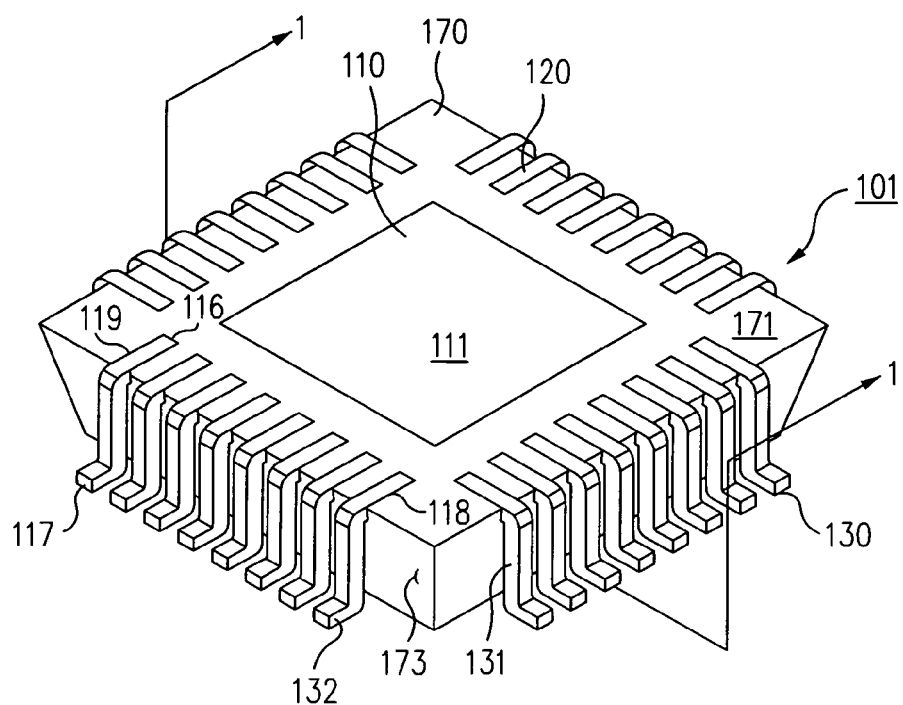
FIG. 1A is a perspective view of a stackable semiconductor package according to one embodiment of the present invention.

FIG. 1A is a perspective view of a stackable semiconductor package 101 according to one embodiment of the present invention. FIG. 1C is a sectional view of semiconductor package 101 taken along the line 1—1 of FIG. 1A.

Referring to FIGS. 1A and 1C, the semiconductor package 101 includes a metal die pad 110; a plurality of metal leads 115, each of which includes an inner lead portion 120 embedded in a plastic encapsulant 170 and an outer lead portion 130 that is fully outside of encapsulant 170 and is integral with the inner lead portion 120; a semiconductor die 140 within encapsulant 170 and mounted on the die pad 110; and a plurality of conductive wires 160 that electrically couple the semiconductor die 140 to the inner lead portions 120.

The die pad 110 includes an approximately planar or planar first surface 111 and an approximately planar or planar second surface 112 that is opposed to the first surface 111. The first and second surfaces 111, 112 are rectangular, e.g., square or oblong rectangular. Accordingly, die pad 110 has four approximately rectilinear side surfaces 113 that extend vertically between first and second surfaces 111, 112. Alternatively, die pad 110 may have other perimeter shapes, such as a triangle, a pentagon, a circle and the like.

The first surface 111 of die pad 110 is fully exposed out of first surface 171 of encapsulant 170, and the side surface 113 and the second surface 112 are fully within encapsulant 170. In an alternative embodiment, the die pad 110 may be set inward into encapsulant 170, so that the die pad is entirely encapsulated, including first surface 111.

The leads 115 each radiate outward from an inner end surface 116 that is near and faces a respective one of the side surfaces 113 of die pad 110 to an outer end surface 117 that is outside of encapsulant 170. The leads 115 each include an encapsulated inner lead portion 120 that begins at the inner end surface 116 of the lead 115, and an exposed outer end portion 130 that begins at an exterior surface of encapsulant 170 and extends to the outer end surface 117 of the lead 115. All of the leads 115 have approximately the same shape. The leads 115 are approximately equal in length and, although they include vertical bends, nonetheless extend straight in a horizontal dimension from the inner end 116 to the outer end surface 117 thereof.

The leads 115 are arranged so that a plurality of the leads 115 extend outward adjacent each of the four sides side surfaces 113 of die pad 110. In other words, there are four rows of leads 115, each of which begins adjacent to a respective one of the side surfaces 113 of die pad 110. In alternative embodiments, the leads may extend outward adjacent to only one, two, or three side surfaces 113 of die pad 110.

The leads 115 are approximately rectangular in a cross-section taken perpendicularly to the length of the lead 115. The leads 115 each include an approximately planar or a planar first surface 121 and an approximately planar or planar second surface 122 opposed to the first surface 121. The leads 115 include opposed longitudinal (i.e., lengthwise direction) side surfaces 118 and 119, and the inner and outer end surfaces 116, 117, that extend vertically between the first and second surfaces 121, 122.

The inner lead portion 120 of each of the leads 115 is embedded in encapsulant 170. The first surface 121 of the inner end portion 120 is exposed at first surface 171 of encapsulant 170. The longitudinal side surfaces 118, 119, the inner end surface 116, and the second surface 122 of the inner portion 120 of each of the leads 115 is fully within encapsulant 170. In the embodiment of FIG. 1A, the three encapsulated edges of first surface 121 of the inner lead portion 120 approximately form an exposed rectangular surface to which other semiconductor packages or electronic devices may be electrically coupled.

The inner lead portions 120 of the leads 115 extend horizontally outward from their respective inner end surface 116 adjacent to die pad 110, and are coplanar with each other and with die pad 110 in this embodiment.

The outer lead portion 130 of each of the leads 115 extends integrally from its respective inner lead portion 120 to its outer end surface 117. The outer lead portion 130 includes two vertical-direction bends between its point of exit from the encapsulant 170 and the outer end surface 117 of the lead 115. That is, each outer lead portion 130 includes a first downward vertical bend just slightly outward of the upper corner of the encapsulant 170, forming a vertical portion 131 that is approximately perpendicular to the inner lead portion 120 and extends along side surface 173 of encapsulant 170, and a second upward and outward vertical bend nearer to the outer end surface 117 of the lead 115, forming a foot portion 132 that extends horizontally outwardly relative to encapsulant 170. Foot portion 132 is approximately perpendicular to vertical portion 131 of the outer lead portion 130 and approximately parallel to inner lead portion 120. Foot portion 132 terminates at the outer end surface 117. The second surface 122 of vertical portion 131 of outer lead portion 130 faces encapsulant 170. The second surface 122 of foot portion 132 typically will face and be soldered to a printed circuit board circuit pattern when semiconductor package 101 is mounted on an external printed circuit board. Of course, the outer lead portion 130 may be bent in other ways, such would form a gull type lead.

The die pad 110 and the leads 115 may be made of a conventional copper (Cu), copper alloy (Cu Alloy), alloy 37 (Ni 37%, Fe 55%), steel plated with copper (Cu) or its equivalent.

The semiconductor die 140 includes an inactive surface 141 and an opposite active surface 142. The inactive surface 141 is bonded to the second surface 112 of the die pad 110 by means of a die attach material 150. A plurality of bond pads 143 are exposed along the edges of the active surface 142 of the semiconductor die 140.

A plurality of conductive wires 160 electrically couple the semiconductor die 140 to the inner lead portions 120 of leads 115. A first end of each wire 160 is bonded to a respective one of the bond pads 143, and an opposite second end of the wire 160 is bonded to the second surface 122 of the inner lead portion 120 of a respective one of the leads 115. The material of the conductive wire 160 may be aluminum (Al), copper (Cu), gold (Au) or the like.

The die pad 110, the inner lead portions 120, the semiconductor die 140, and the conductive wires 160 are encapsulated by the encapsulant 170. The encapsulant 170 is an insulative material, e.g., an epoxy-based mold compound, that is formed into a solid body. The encapsulant 170 includes an approximately planar or planar first surface 171 that is coplanar with the exposed first surfaces 111, 121 of the die pad 110 and the inner lead portions 120, respectively; an approximately planar or planar second surface 172 opposed to the first surface 171; and tapered peripheral side surfaces 173 that extend vertically between the first and second surfaces 171, 172. The first surface 111 of the die pad 110 and the first surface 121 of the inner lead portion 120 of the leads 115 are coplanar with and exposed through the first surface 171 of encapsulant 170. The second surface 122 of the foot portion 132 of the outer lead portion 130 of each of the leads 115 is approximately parallel with second surface 172 of encapsulant 170, but is slightly vertically below the second surface 172 so that a good solder connection can be made between the foot portion 132 and an external printed circuit board without interference by encapsulant 170.

Figure 1B:
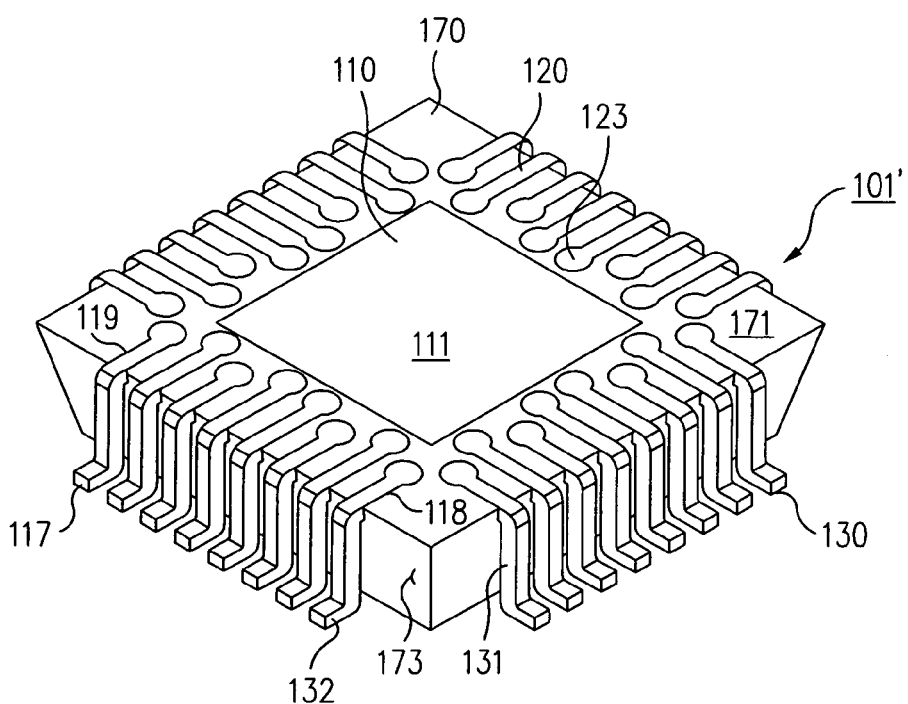
FIG. 1B is a perspective view of a stackable semiconductor package according to another embodiment of the present invention.
Figure 1C:
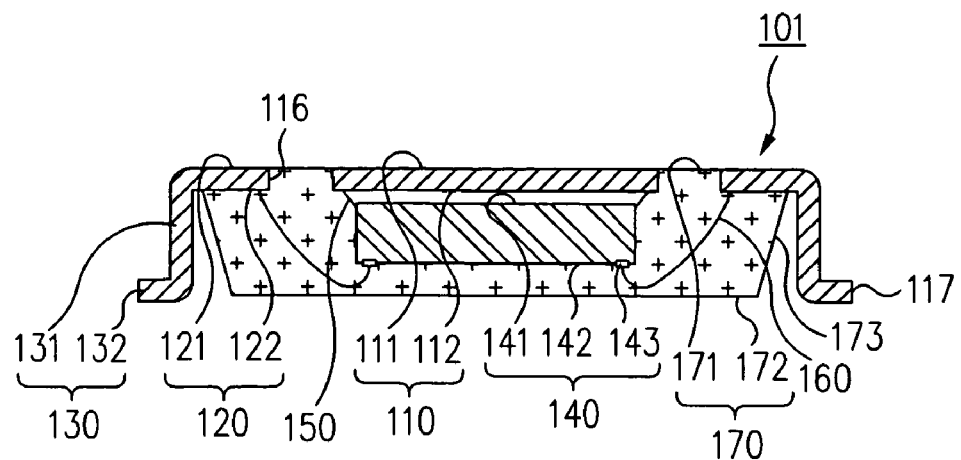
FIG. 1C is a sectional view of the stackable semiconductor package of FIG. 1A taken along the line 1—1 of FIG. 1A.

FIG. 1B provides a perspective view of a stackable semiconductor package 101' according to another embodiment of the present invention. Semiconductor package 101' is the same as semiconductor package 101, described above, except for the shape of the inner terminus of inner lead portion 120. In particular, the first and second surfaces 121, 122 of each of the inner lead portions 120 are formed to include a circular region, thereby forming a circular land 123' at the inner terminus of the inner lead portion 120 of the lead 115. The lands 123' are each disposed near, but spaced from, a respective one of the side surfaces 113 of die pad 110. The lands 123' adjacent each of the four side surfaces 113 are staggered, with every other land 123' being further from the respective side wall 113 than the next adjacent land 123' (or lands 123'). Accordingly, there are two rows of lands 123' adjacent to each of the four side walls 113 of die pad 110, with an inner row of the lands 123' being closer to the side wall 113 than an outer row of the lands 123'. Forming a land 123' may facilitate the stacking of a semiconductor package having solder ball interconnects with semiconductor package 101'.

Figure 1D:
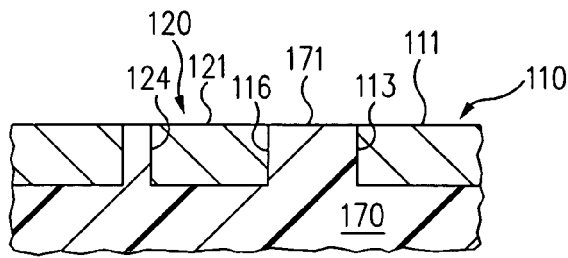
FIG. 1D is a sectional view of an alternative lead.
Figure 1E:
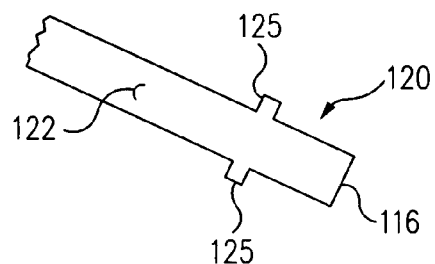
FIG. 1E is a top plan view of an alternative lead.

In one embodiment, the inner lead portions 120 of each of the leads 115 of semiconductor packages 101, 101' may be provided with horizontally-acting locking means that that would enhance the connection of the leads 115 to the encapsulant 170. For instance, the bulbous shape of the lands 123' of semiconductor package 101' would resist a force that would tend to pull the inner lead portion 120 horizontally from the encapsulant 170. Referring to FIG. 1D, another feature that may be incorporated into each of the inner lead portions 120 to resist such a horizontal direction force is an aperture 124 that extends vertically and entirely through the inner lead portion 120 from first surface 121 to second surface 122. The encapsulant 170 fills the aperture 124, thus locking the lead 115 to encapsulant 170. Referring to FIG. 1E, another feature that may be incorporated into each of the inner lead portions 120 to resist such a horizontal direction force is one or two anchor ears 125 that are integral with the inner lead portion 120 and project outwardly from the longitudinal side surfaces 118, 119 of inner lead portion 120 into encapsulant 170.

Figure 1F:
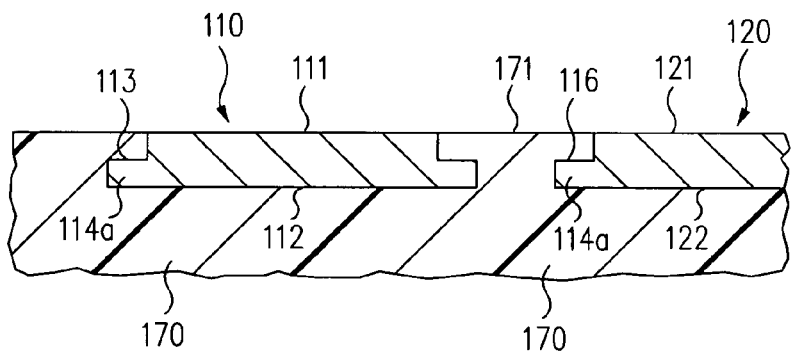
FIGS. 1F–1I are sectional views of alternative leads and die pads.
Figure 1G:
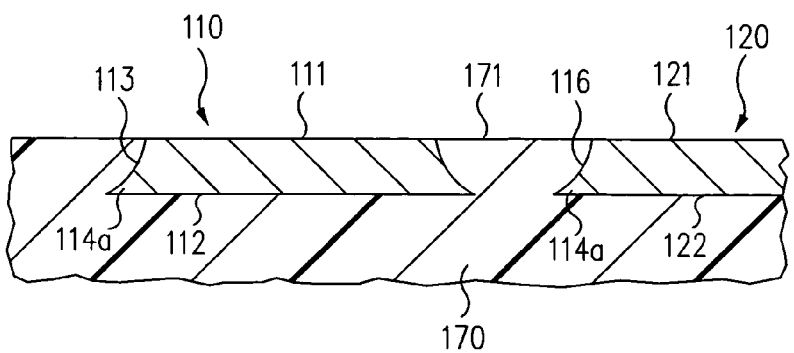

The die pad 110 and leads 115 may also include vertically-acting locking means that would resist a force that would tend to pull the lead 120 vertically from the encapsulant 170 (i.e., in a direction upward from first surface 171 of encapsulant 170). Referring to FIGS. 1F and 1G, for instance, the side surfaces 113 of die pad 110 may be provided with a lip 114a fully around the die pad 110. The lip 114a begins at second surface 112 of the die pad 110 and terminates at a point below first surface 111 of die pad 110. The lip 114a is covered by encapsulant 170, thereby locking the die pad 110 to the encapsulant 170. The lip 114a of FIG. 1E may be formed, for instance, by mechanical stamping, coining, or photolithography and chemical etching. The lip 114a of FIG. 1G may be formed by photolithography and chemical etching from one side of the metal sheet used to make the leadframe, wherein the metal sheet is underetched. The lip 114a of FIG. 1G is more typical of a chemically-etched leadframe, in that the etched surfaces tend not to have sharp edges.

Figure 1H:
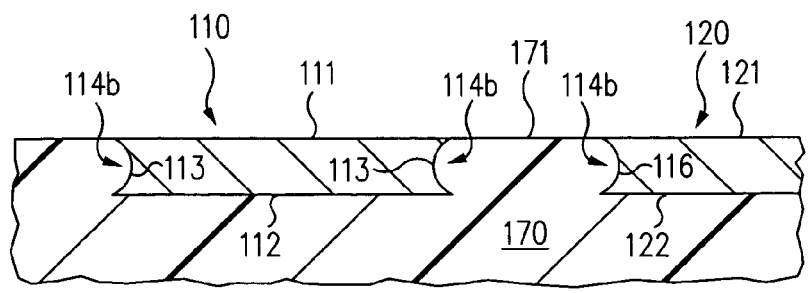

Alternatively, referring to FIG. 1H, the side surfaces 113 of the die pad 110 may be provided with a central concave region 114b that fills with encapsulant 170. The central concave region 114b may be formed by photolithography and chemical etching from both sides of the metal sheet, wherein the metal is overetched.

Figure 1I:
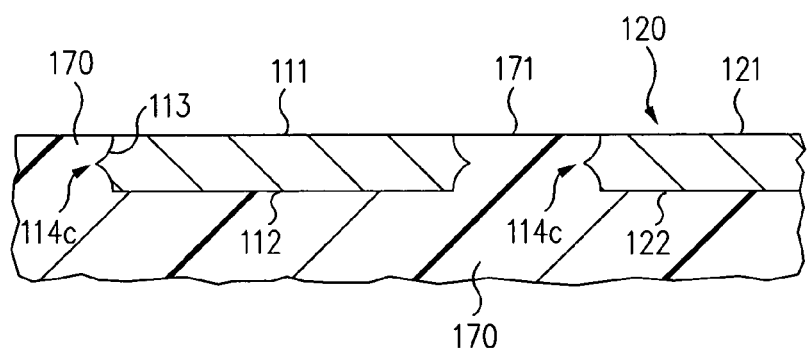
Figure 1J:
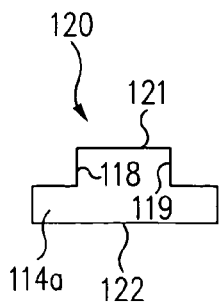
FIGS. 1J–1M are sectional views of alternative leads.
Figure 1K:
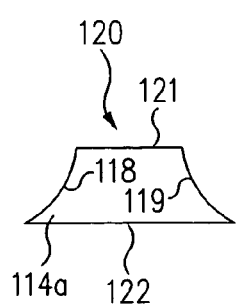
Figure 1L:
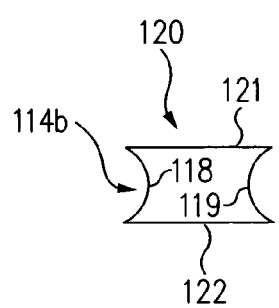
Figure 1M:
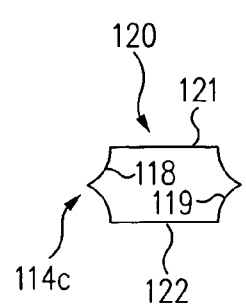

Alternatively, referring to FIG. 1I, the side surfaces 113 of the die pad 110 may be provided with a central projecting region 114c that is covered by the encapsulant 170. The central projecting region 114c may be formed by photolithography and chemical etching from both sides of the metal sheet, wherein the metal is underetched.

Similarly, the encapsulated inner end surface 116 and the longitudinal side surfaces 118, 119 of the inner lead portions 120 of the leads 115 may be provided with a lip 114a, a central concave region 114b, or a central projecting region 114c, as is shown in FIGS. 1F–1I, respectively, and FIGS. 1J–1M, respectively. These side surface features are covered by encapsulant 170, and help prevent the leads 115 from being pulled vertically from first surface 171 of encapsulant 170. These side surface treatments may extend along the longitudinal side surfaces 118, 119 of the outer lead portions 130 if such would facilitate manufacturing.

Figure 1N:
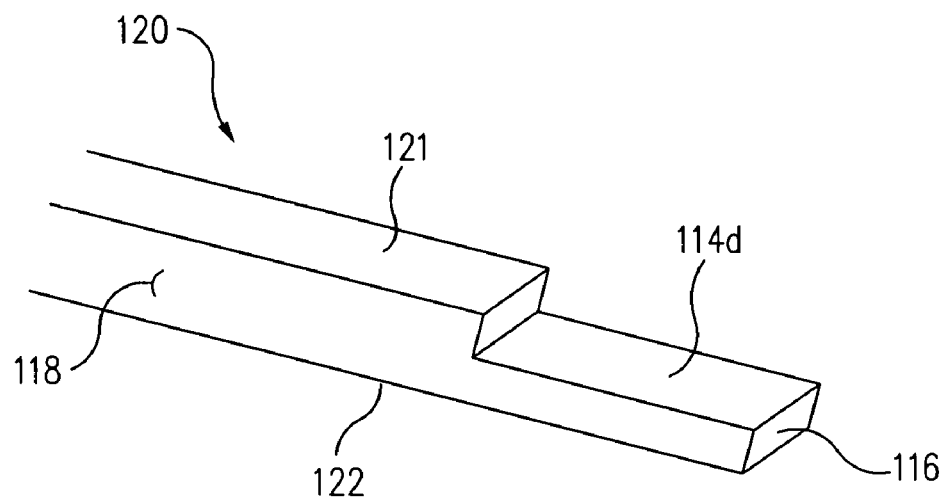
FIGS. 1N and 1O are perspective views of alternative leads.
Figure 1O:
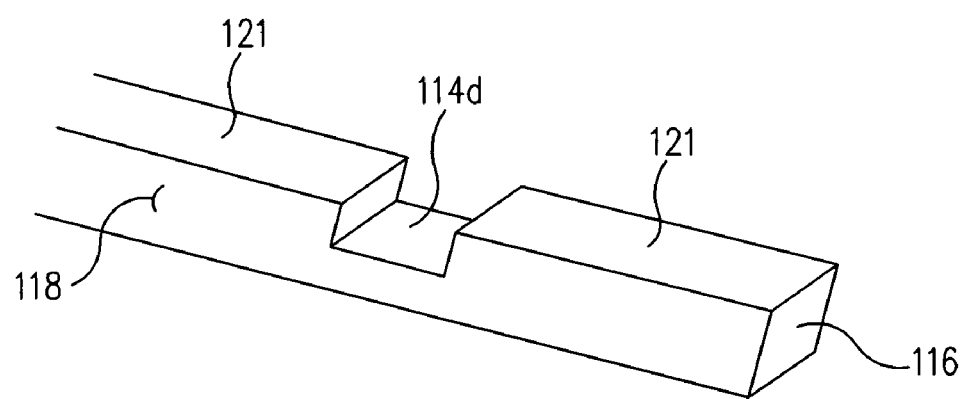
Figure 1P:
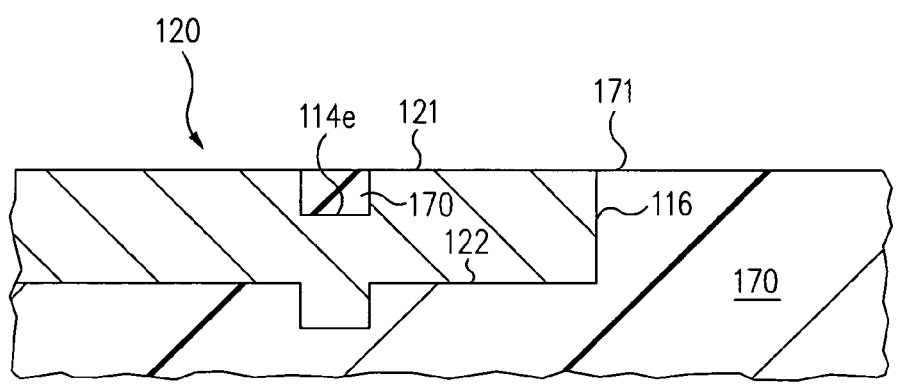
FIG. 1P is a sectional view of an alternative lead.

In a further alternative embodiment, a vertically-acting lead lock may be provided by forming a recess into the inner lead portion 120 from first surface 121. For instance, referring to FIG. 1N, a recess from first surface 121 may vertically terminate at a horizontal recessed surface 114d that is about half of the distance between first and second surfaces 121, 122. The recessed surface 114d begins at the inner end surface 116 of the inner lead portion 120 and extends laterally through a subportion of the length of inner lead portion 120. Alternatively, the recess 114d may begin and end inward of inner end surface 116 of inner lead portion 120, as shown in FIG. 1O. The recessed surface 114d is covered by encapsulant 170, thereby locking the inner lead portion 120 to the encapsulant 170. Such a recessed surface 114d may be formed by photolithography and chemical etching. Again, note that chemical etching tends not to form surfaces as sharp as those depicted in the figures. Alternatively, referring to FIG. 1P, a recess 114e may be formed into inner lead portion 120 from first surface 121 by coining. A semiconductor package 101, 101' including the recessed surface 114d, or the recess 114e may also include a die pad 110 with the features of FIGS. 1F–1I, and/or a downset die pad 110.

Since the first surface 121 of each of the inner lead portions 120 and the first surface 111 of die pad 110 are exposed in the horizontal plane of first surface 171 of encapsulant 170, various external electrical devices can be stacked onto the semiconductor packages 101, 101' of FIGS. 1A, 1B, and have their input/output terminals (e.g., leads or solder balls) electrically coupled to the exposed first surfaces 111 of inner lead portions 120 and/or to the exposed first surface 111 of die pad 110.

Figure 2:
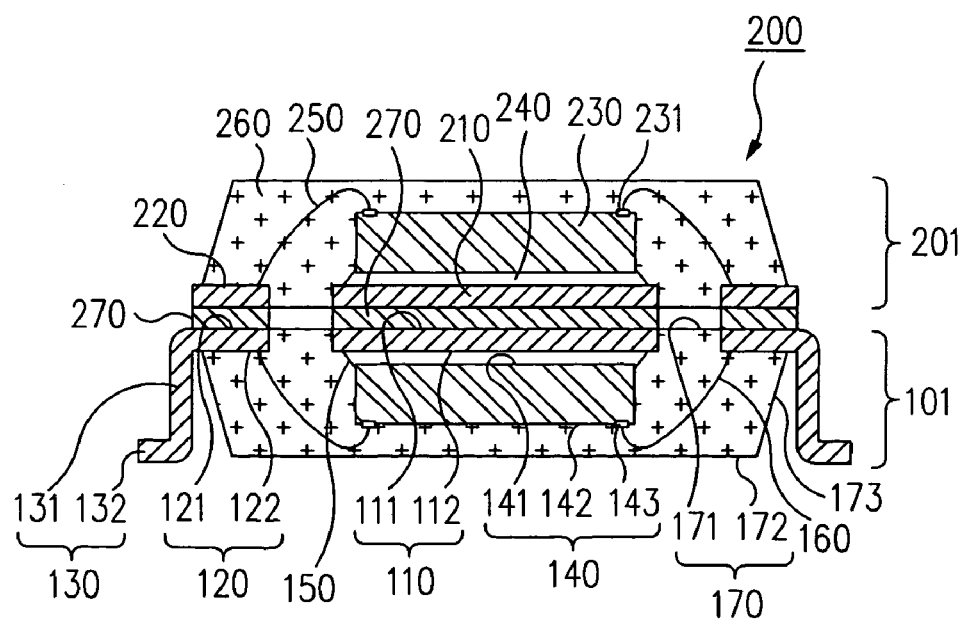
FIG. 2 is a sectional view of a stack of semiconductor packages according to another embodiment of the present invention.

For instance, FIG. 2 illustrates a stack 200 of semiconductor packages according to another embodiment of the present invention. Stack 200 includes a lowermost semiconductor package 101 (or 101') upon which a second semiconductor package 201 is stacked. The type of semiconductor package 201 may vary, as long as it is compatible for electrical connection to the exposed portions of the inner lead portions 120 and/or die pad 110 of semiconductor package 101.

The semiconductor package 201 is a conventional Micro leadframe Package (MLF), a.k.a., QFN (quad flat no leads) package. It includes a planar die pad 210, a plurality of inner leads 220 around the periphery of the die pad 210, a semiconductor die 230 coupled to the die pad 210 by an adhesive layer 240, a plurality of conductive wires 250 that electrically couple the bond pads 231 of semiconductor die 230 to the leads 220, and an encapsulant 260. A lowermost surface of the die pad 210 and each of the leads 220 is exposed in the plane of the lower exterior surface of encapsulant 260. The adhesive layer 240 may be electrically insulating or electrically conductive.

The exposed lowermost surface of the die pad 210 of semiconductor package 200 faces the first surface 111 of die pad 110 of semiconductor package 101 and is coupled to the first surface 111 by an electrically conductive layer 270. In addition, the exposed lowermost surface of each of the leads 220 of semiconductor package 201 faces the exposed first surface 121 of a corresponding one of the inner lead portions 120 of semiconductor package 101 and is coupled to the first surface 121 by an electrically conductive layer 270. Conductive layer 270 may be a metal solder, an electrically conductive epoxy-based material, or the like. Accordingly, the semiconductor packages 101 and 201 of stack 200 are electrically interconnected via their leads and die pads through the conductive layers 270. Electrical signals may pass from an external printed circuit board to which the foot portions 132 of outer lead portions 130 of semiconductor package 101 are coupled to semiconductor dies 140, 230, or from semiconductor die 140 to semiconductor die 230, and vice versa.

The types of semiconductor dies 140, 230 packaged in semiconductor packages 101 and 201, respectively, may vary, e.g., may be memory, logic, or processor type devices, radio frequency devices, passive devices, power devices, and so forth.

The stack 200 provides for increased functionality by allowing two semiconductor packages to be mounted in a printed circuit board region that normally would only be occupied by a single semiconductor package.

Figure 3:
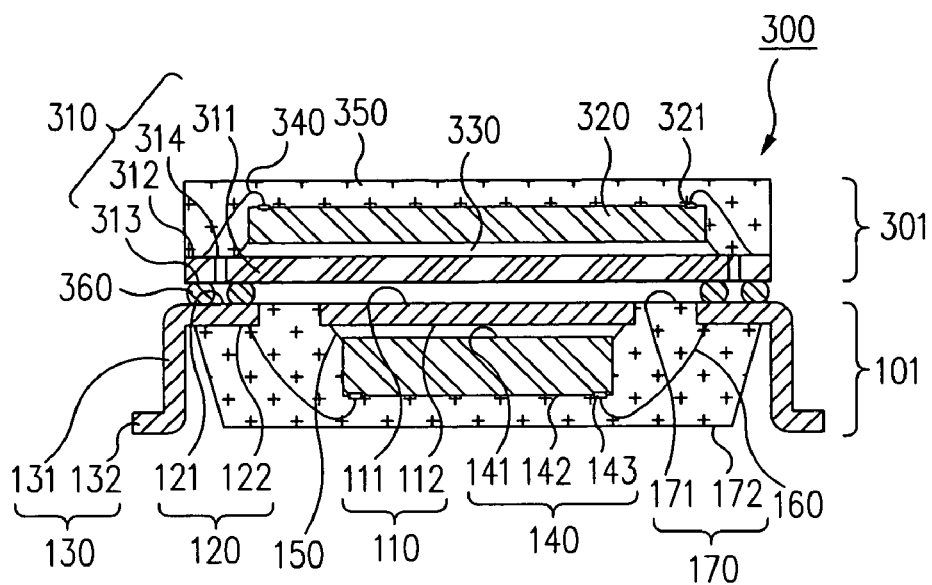
FIG. 3 is a sectional view of a stack of semiconductor packages according to another embodiment of the present invention.

Referring to FIG. 3, an alternative stack 300 of semiconductor packages according to another embodiment of the present invention is illustrated. Stack 300 includes a ball grid array semiconductor package 301, which may be a conventional Chip Scale Package (CSP), which is stacked on and electrically coupled to a lowermost semiconductor package 101 (or 101'). Alternatively, semiconductor package 301 may be a Land Grid Array semiconductor package.

Semiconductor package 301 includes a substrate 310 having a plurality of electrically conductive patterns 312, 313 formed on upper and lower surfaces, respectively, of an insulative core layer 311. The circuit patterns 312 and 313 are electrically coupled to each other through the substrate 310 by vias 314. A semiconductor die 320 is coupled to the top surface of substrate 310 by an adhesive layer 330. A plurality of conductive wires 340 electrically connect the bond pads 321 of semiconductor die 320 with the upper circuit patterns 312. A plurality of solder balls 360 are fused to the lower circuit patterns 313 of the substrate 310, and allow for electrical signals to pass to and from semiconductor package 301. Encapsulant 350 covers semiconductor die 320 and the upper surface of substrate 310.

The solder balls 360 of semiconductor package 301 are each fused to the exposed first surface 121 of a respective one of the inner lead portions 120 of the leads 115 of semiconductor package 101. Accordingly, electrical signals may pass from an external printed circuit board to which the foot portions 132 of outer lead portions 130 of semiconductor package 101 are coupled to semiconductor dies 140, 320, or from semiconductor die 140 to semiconductor die 320, and vice versa. The types of semiconductor dies 140, 320 packaged in semiconductor packages 101 and 301, respectively, of stack 300 may vary, e.g., may be memory, logic, or processor type devices, radio frequency devices, passive devices, power devices, and so forth.

Figure 4:
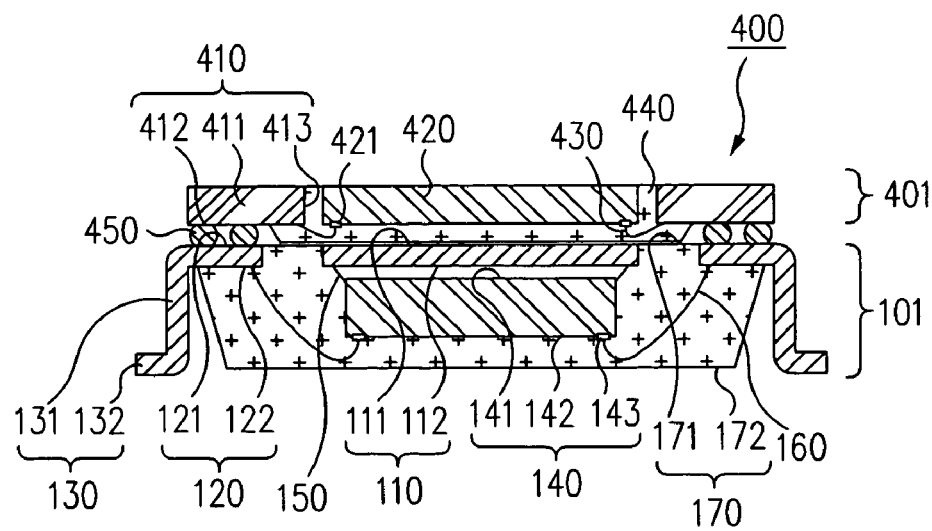
FIG. 4 is a sectional view of a stack of semiconductor packages according to another embodiment of the present invention.

Referring to FIG. 4, an alternative stack 400 of semiconductor packages according to another embodiment of the present invention is illustrated. Stack 400 includes an alternative ball grid array semiconductor package 401, which may be a conventional Extremely Thin Chip Scale Package (etCSP), which is stacked on and electrically coupled to a lowermost semiconductor package 101 (or 101').

Semiconductor package 401 includes a substrate 410 having a plurality of electrically conductive patterns 412 formed on a lower surface of an insulative core layer 411. A semiconductor die 420 is suspended within an aperture 413 through core layer 411 by a hardened encapsulant 440. A plurality of conductive wires 430 electrically connect the bond pads 421 of semiconductor die 420 with the circuit patterns 412. A plurality of solder balls 450 are fused to the circuit patterns 412 and allow for electrical signals to pass to and from semiconductor package 401. Encapsulant 440 covers semiconductor die 420 and the lower surface of substrate 410 around aperture 413. The inactive surface of semiconductor die 420 is exposed and coplanar with an upper exterior surface of encapsulant 440 and substrate 410.

The solder balls 450 of semiconductor package 401 are each fused to the exposed first surface 121 of a respective one of the inner lead portions 120 of the leads 115 of semiconductor package 101. Accordingly, electrical signals may pass from an external printed circuit board to which the foot portions 132 of outer lead portions 130 of semiconductor package 101 are coupled to semiconductor dies 140, 420, or from semiconductor die 140 to semiconductor die 420, and vice versa. The types of semiconductor dies 140, 420 packaged in semiconductor packages 101 and 401, respectively, may vary, e.g., may be memory, logic, or processor type devices, radio frequency devices, passive devices, power devices, and so forth.

Figure 5:
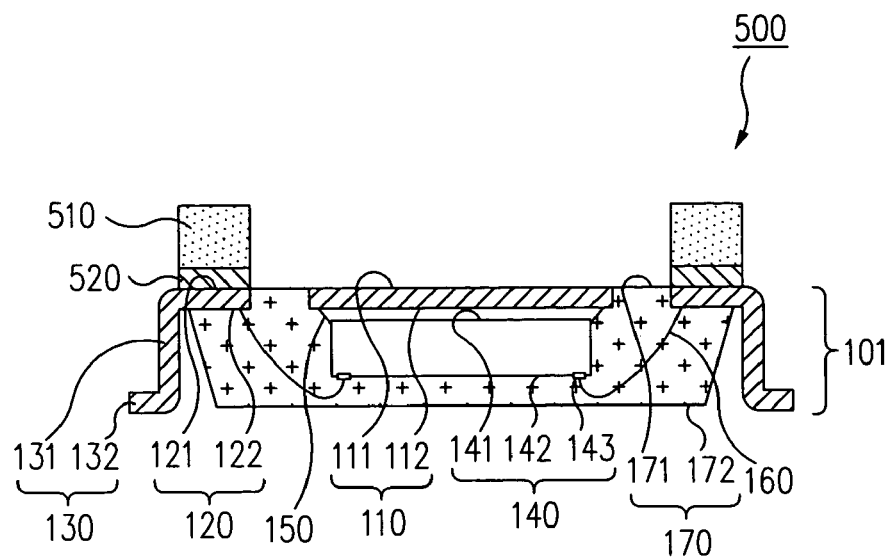
FIG. 5 is a sectional view of an electronic device stacked on a stackable semiconductor package according to another embodiment of the present invention.

Referring to FIG. 5, an alternative stack 500 according to another embodiment of the present invention is illustrated. Stack 500 includes an electronic device 510 that is stacked on and electrically coupled to a lowermost semiconductor package 101 (or 101'). The type of electronic device 510 may vary. For instance, electronic device 510 may be a MEMS device, a pressure sensor, an acceleration sensor, a print head, a DMD (Digital Micromirror Device), and so forth. Each electronic device 510 includes one or more terminals, each of which faces and is electrically coupled by an electrically conductive layer 520 (e.g., solder, conductive epoxy) to the exposed first surface 121 of the inner portion 120 of a corresponding one of the leads 115 of semiconductor package 101. Accordingly, electrical signals may pass from an external printed circuit board to which the foot portions 132 of outer lead portions 130 of semiconductor package 101 are coupled to semiconductor die 140 and electronic device 510, or from semiconductor die 140 to electronic device 510, and vice versa.

Figure 6:
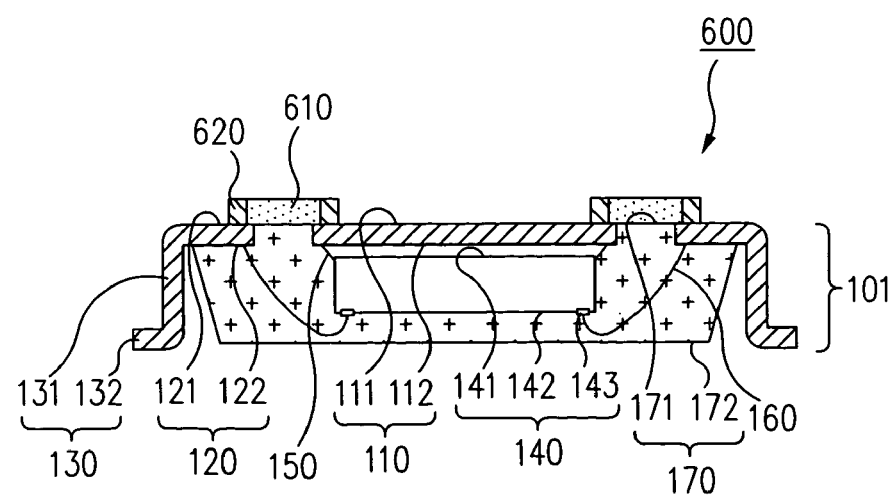
FIG. 6 is a sectional view of a passive device stacked on a stackable semiconductor package according to another embodiment of the present invention.

Referring to FIG. 6, an alternative stack 600 according to another embodiment of the present invention is illustrated. Stack 500 includes a passive device 610 that is stacked on and electrically coupled to a lowermost semiconductor package 101 (or 101'). The type of passive device 610 may vary, e.g., resistor, capacitor, or inductor. FIG. 6 shows two passive devices 610 that are each electrically coupled by an electrically conductive layer 620 (e.g., solder, conductive epoxy) between the exposed first surface 121 of an inner lead portion 120 of a lead 115 and the exposed first surface 111 of die pad 110. Alternatively, the passive device 610 may be electrically coupled between the first surfaces 121 of a pair of inner lead portions 120.

Figure 7:
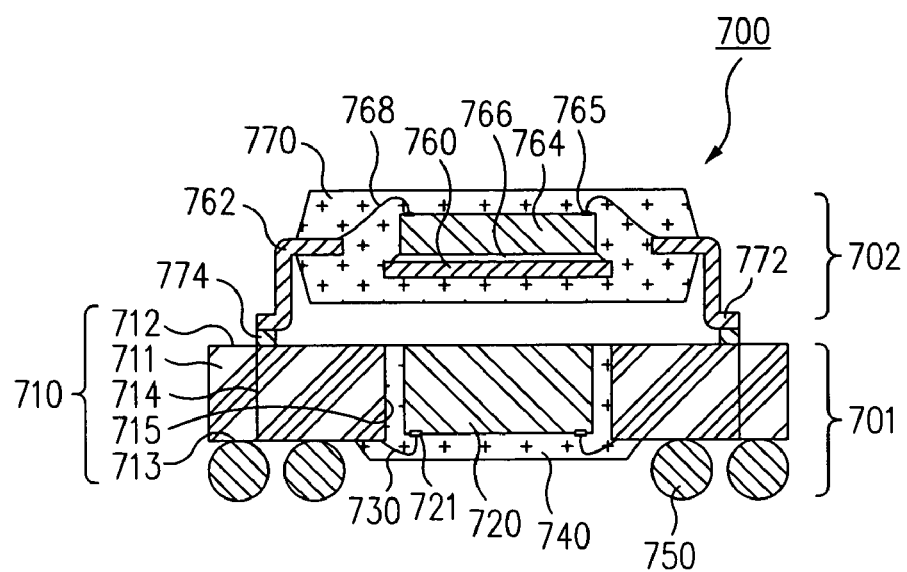
FIG. 7 is a sectional view of a stack of semiconductor packages according to another embodiment of the present invention.

Referring to FIG. 7, an alternative stack 700 according to another embodiment of the present invention is illustrated. Stack 700 includes a lowermost etCSP type package 701 upon which a leadframe-based semiconductor package 702 is stacked.

Semiconductor package 701 includes a substrate 710 having a plurality of electrically conductive patterns 712, 713 formed on upper and lower surfaces, respectively, of an are electrically coupled to each other through the core layer 711 by vias 714. A semiconductor die 720 is suspended within an aperture 715 through core layer 711 by a hardened encapsulant 740. The active surface of semiconductor die 720 is oriented in a same downward direction as the lower circuit patterns 713. A plurality of conductive wires 730 electrically connect the bond pads 721 of semiconductor die 720 with the lower circuit patterns 713. A plurality of solder balls 750 are fused to the lower circuit patterns 713 of the substrate 710. The solder balls 750 ultimately are fused to circuit patterns of an external printed circuit board, and allow for electrical signals to pass to and from semiconductor package 701. Encapsulant 740 covers semiconductor die 720 and a subportion of the upper surface of substrate 710 around aperture 715. The inactive surface of semiconductor die 720 is exposed in a common plane with the upper surface of substrate 710 and an upper exterior surface of encapsulant 740.

Meanwhile, leadframe semiconductor package 702 includes a metal planar downset die pad 760, a plurality of metal leads 762 radiating outward from an inner end adjacent die pad 760, a semiconductor die 764 bonded to the die pad 760 by an adhesive layer 766, a plurality of conductive wires 768 that electrically couple bond pads 765 to the encapsulated inner portions of leads 762, and an encapsulant 770 that covers the semiconductor die 764 and the inner portion of the leads 762. An outer portion of the leads 762 extends outward from the peripheral vertical sides of the body of encapsulant 770, and includes two vertical bends. A horizontally extending foot portion 772 is at the outer end of the leads 762. The manner of bending the outer lead portions can vary, e.g., J-lead, gull wing lead. Semiconductor package 702 may be a conventional Quad Flat Package (QFP) or a Dual Inline Package (DIP).

The bottom surface of the foot portion 772 of the leads 762 of semiconductor package 702 face, and are electrically coupled by a conductive layer 774 (e.g., solder, conductive epoxy) to, the exposed portions of the upper circuit patterns 712 on the upper surface of substrate 710 of semiconductor package 701 outward of the encapsulant 740 and aperture 715. Accordingly, electrical signals may pass from an external printed circuit board to which the solder balls 750 of semiconductor package 701 are coupled to semiconductor dies 720 and 764, or from semiconductor die 720 to semiconductor die 764, and vice versa.

Figure 7A:
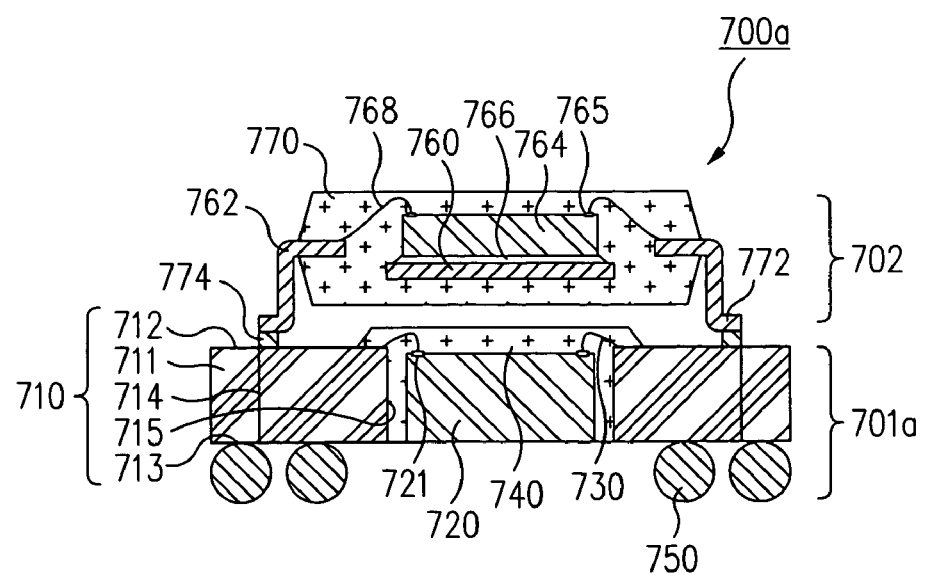
FIG. 7A is a sectional view of a stack of semiconductor packages according to another embodiment of the present invention.

FIG. 7A illustrates an alternative stack 700a of electrically coupled semiconductor packages according to another embodiment of the present invention is illustrated. Stack 700a is identical to stack 700, except that lower semiconductor package 701a differs slightly from semiconductor package 701 of stack 700 of FIG. 7A. In particular, in semiconductor package 701a of stack 700a, the semiconductor die 720 is oriented in a same upward direction as the upper circuit patterns 712. As a result, the bond pads 721 are electrically coupled by wires 730 to the upper circuit patterns 712 of substrate 710. Moreover, encapsulant 740 covers a subportion of the upper surface of substrate 710 around aperture 715.

Figure 7B:
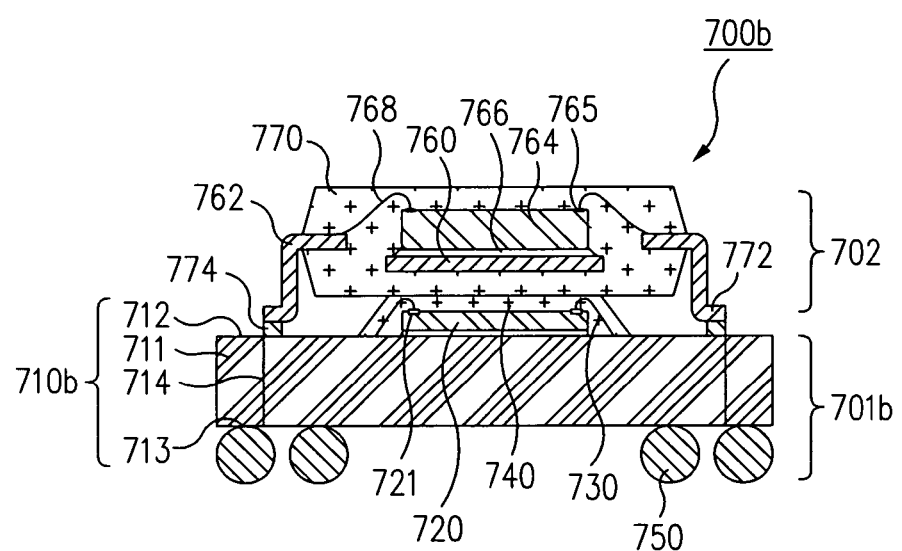
FIG. 7B is a sectional view of a stack of semiconductor packages according to another embodiment of the present invention.

FIG. 7B illustrates an alternative stack 700b of electrically coupled semiconductor packages according to another embodiment of the present invention. Stack 700b is identical to stack 700a of FIG. 7A, except that lower semiconductor package 701b differs slightly from semiconductor package 701a of stack 700a of FIG. 7A. In particular, in semiconductor package 701b of stack 700b, the semiconductor die 720 is coupled to the upper surface of a substrate 710b, rather than in an aperture through the core layer 711 of the substrate 710.

FIG. 8A through FIG. 8F illustrate stages in a method for manufacturing a semiconductor package 101, and a stack 200, according to one embodiment of the present invention.

Figure 8A:
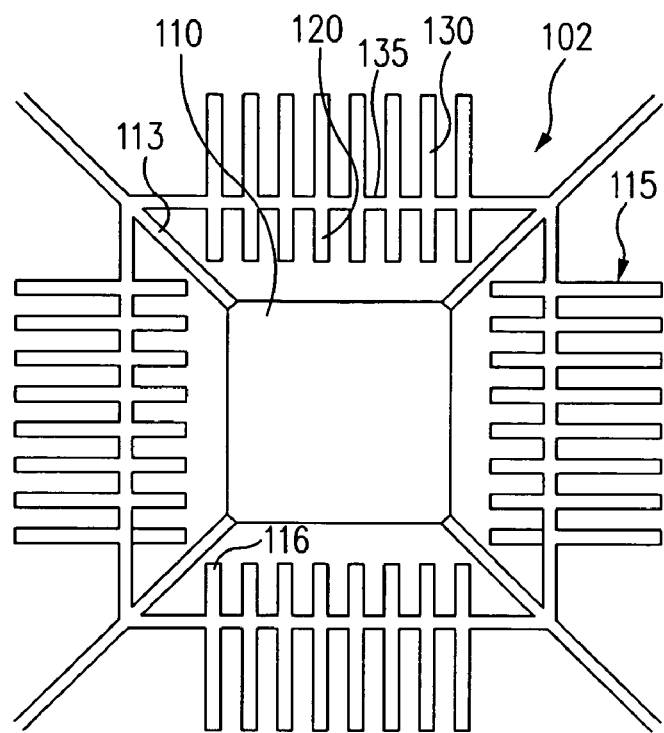
FIG. 8A through FIG. 8F illustrate stages in a method of making a semiconductor package and a stack including the semiconductor package.

Referring to FIG. 8A, a planar metal leadframe 102 is provided. The leadframe 102 may be formed by stamping or chemically etching a metal sheet. The leadframe 102 includes a rectangular central die pad 110 integrally supported at each of its four corners by a tie bar 113 that extends integrally from an inner corner of a rectangular dam bar 135. Leads 115 also extend integrally from dam bar 135, with each of the inner lead portions 120 extending integrally from an interior side of one of the four rectilinear segments of dam bar 135, and outer lead portions 130 extending from an opposite exterior side of the dam bar 135 segment. The die pad 110 may be downset from the inner lead portions at this stage in the process.

Figure 8B:
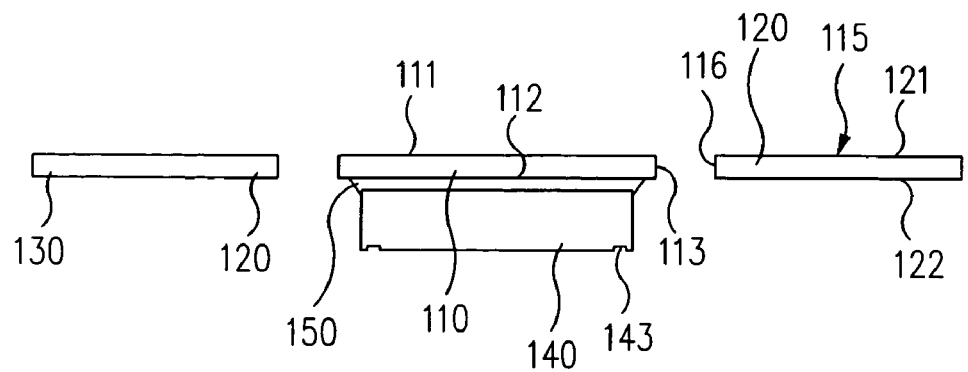

Referring to FIG. 8B, the semiconductor die 140 is bonded to the second surface 112 of the die pad 110 by means of an adhesive layer 150.

Figure 8C:
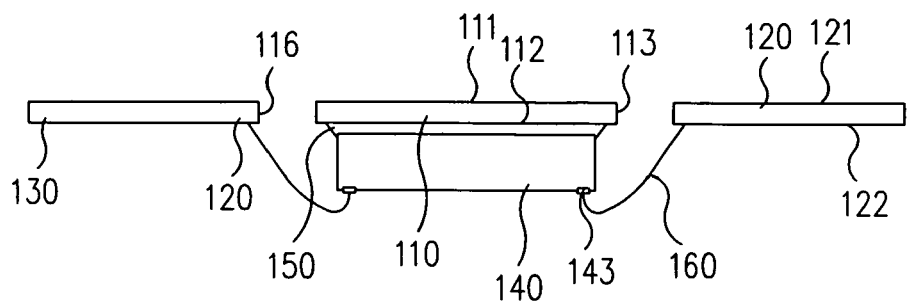

Referring to FIG. 8C, the bond pads 143 of the semiconductor die 140 are electrically coupled to the second surface 122 of the inner lead portions 120 by conductive wires 160.

Figure 8D:
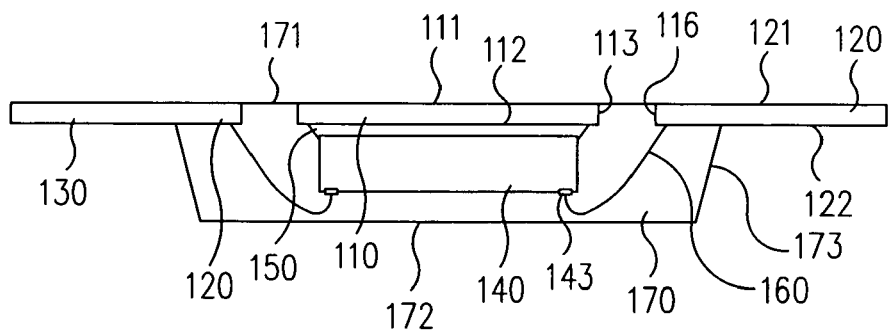
Figure 8E:
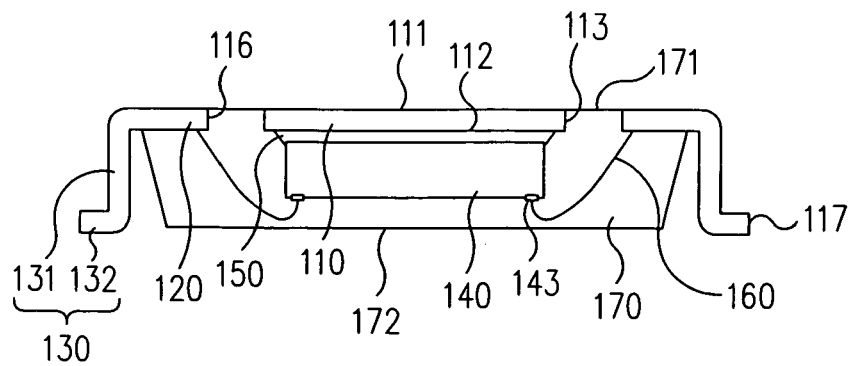

Referring to FIG. 8D, the leadframe 102 and the semiconductor die 140 are encased in a body of encapsulant 170. Typically, the leadframe 102 and semiconductor die 140 are inserted into a mold cavity, and a molten insulative material, e.g., epoxy-based molding compound, is injected into the mold cavity, and then hardened. The mold cavity is arranged to clamp in a manner that keeps the encapsulant 170 within dam bar 135, while also ensuring that the encapsulant 170 does not cover the first surfaces 111, 121 of the die pad 110 and leads 115, respectively.

Subsequently, in trim and form steps, the portions of dam bar 135 between the individual leads 115, and between the leads 115 and tie bars 113, are removed. In addition, if the outer ends of the outer lead portions are not free (as shown), but rather are coupled to an outer portion (not-shown) of the leadframe 102, then the outer lead portions 130 are severed across their length, forming the outer end surfaces 117 of the leads. The outer lead portions 130 are bent first in a inward, downward vertical direction, and then in an upward outward direction, to form vertical lead portion 131 and foot portion 132. Accordingly, the formation of semiconductor package 101 is completed.

Practitioners will appreciate that a plurality of semiconductor packages 101 may be assembled on a metal strip that contains a plurality of interconnected leadframes 102. After the encapsulation step, the plurality of individual packages 101 may be singulated from their respective portion of the strip.

Figure 8F:
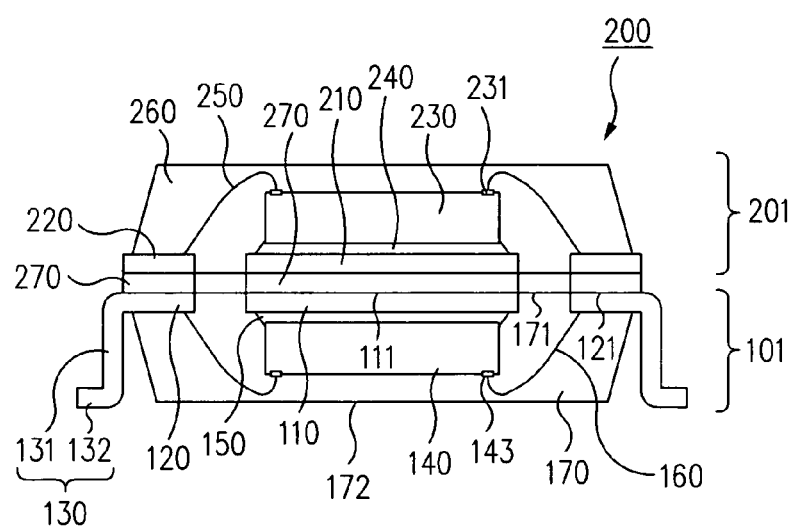
Figure 9A:
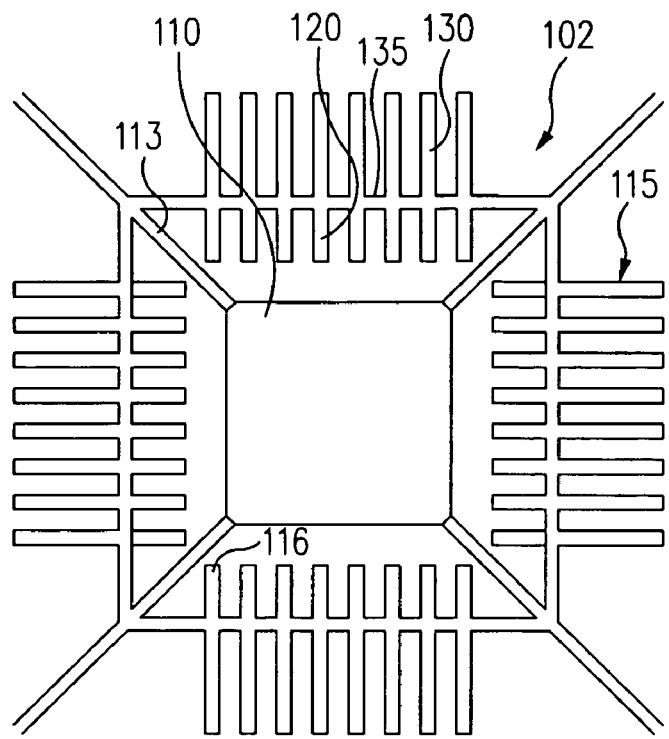
FIG. 9A through FIG. 9F illustrate stages in another method of making a semiconductor package and a stack including the semiconductor package.
Figure 9B:
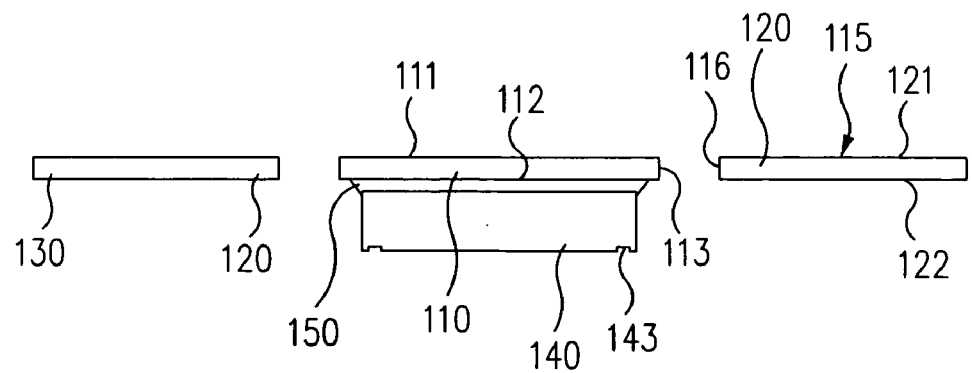
Figure 9C:
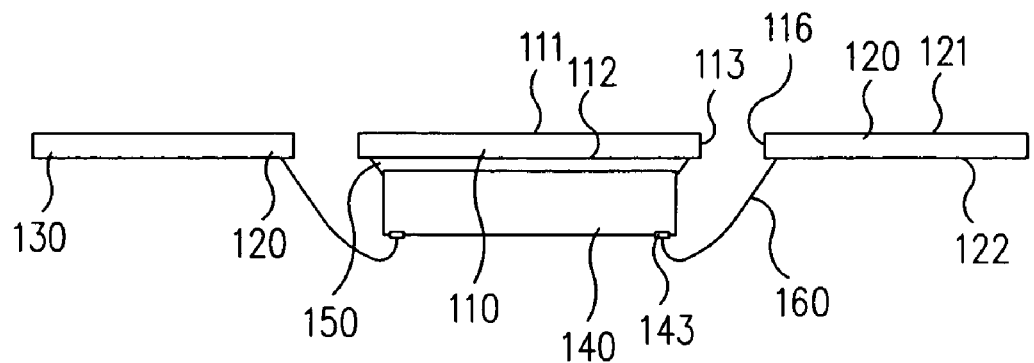
Figure 9D:
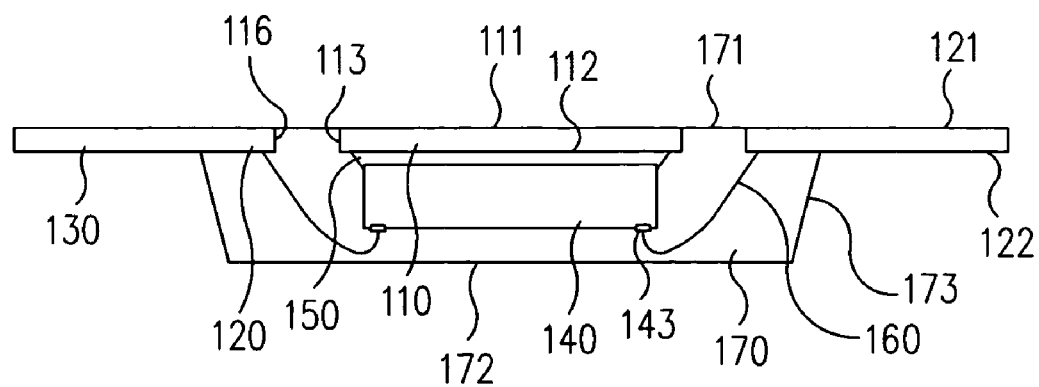
Figure 9E:
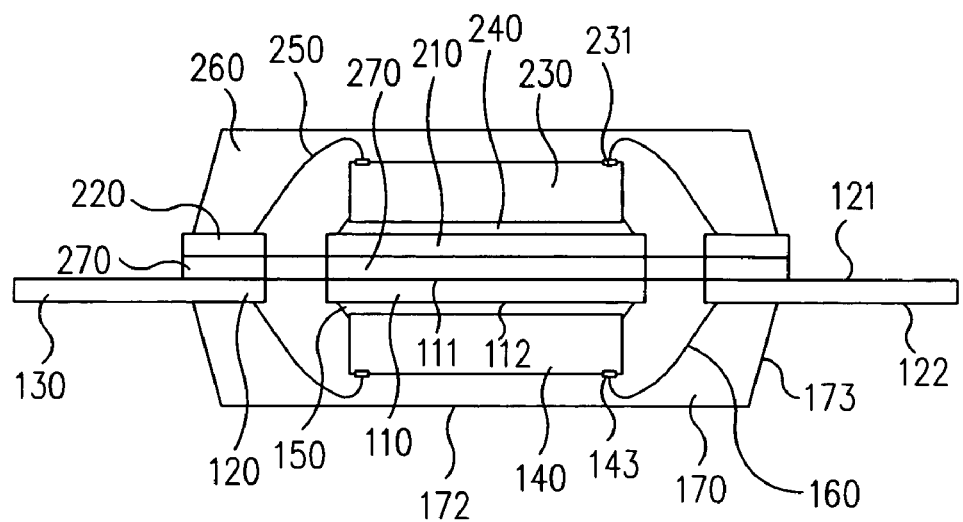
Figure 9F:
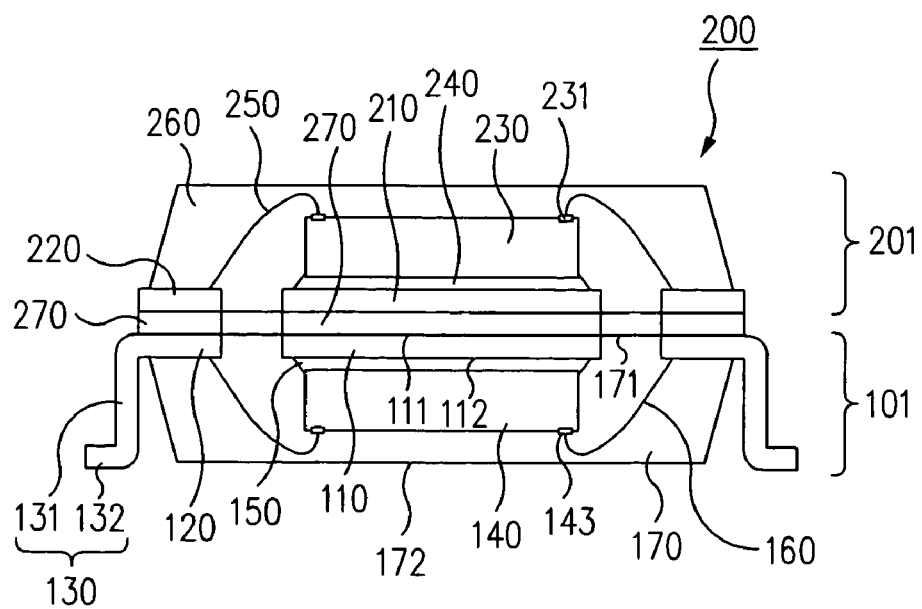

Referring to FIG. 8F, the stacking step that forms stack 200 of FIG. 2 is illustrated. In particular, the second semiconductor package 201 is stacked on the upper planar surface of semiconductor package 101, which is composed of first surfaces 111, 121, and 171 of die pad 110, inner lead portion 120 of leads 115, and first surface 171 of encapsulant 170, respectively. The exposed lower surfaces of leads 220 and optionally die pad 210 of semiconductor package 201 are electrically coupled by conductive layer 270 to the first surfaces 121, 111 of inner lead portions 120 and die pad 110, respectively.

FIG. 9A through FIG. 9F illustrate stages in an alternative method for manufacturing a semiconductor package 101, and a stack 200, according to one embodiment of the present invention. The steps are the same as those described above for FIGS. 8A–8F, except that, in the process of FIGS. 9A–9F, the stacking step and the trim and form steps are interchanged. Otherwise, the above-description of FIGS. 8A–8F applies.

This disclosure provides exemplary embodiments of the present invention. The scope of the present invention is not limited by these exemplary embodiments. Numerous variations, whether explicitly provided for or implied by the specification, such as variations in structure, dimension, type of material and the manufacturing process may be implemented by one who is skilled in the art, in view of this disclosure.

What is claimed is:

1. A semiconductor package comprising:
   a metal die pad, and a plurality of metal leads each radiating away from the die pad, with the die pad and the respective leads each having a first surface and an opposite second surface, and peripheral side surfaces between the first and second surfaces;
   a semiconductor die coupled to the second surface of the die pad and electrically coupled to the second surface of the leads; and
   a hardened plastic encapsulant including an exterior planar first surface, an exterior second surface opposite the first surface, and exterior peripheral side surfaces between the first and second surfaces,
   wherein a lengthwise inner lead portion of each of the leads is embedded in the encapsulant, and a remaining outer lead portion of each of the leads extends outwardly from a respective one of the side surfaces of the encapsulant, the outer lead portion comprising a vertical portion that is approximately perpendicular to the inner lead portion and a foot portion that extends from the vertical portion outwards relative to the encapsulant,
   wherein the semiconductor die, the second surface and peripheral side surfaces of the die pad, and the second surface and peripheral side surfaces of the inner lead portion of each of the leads are within the encapsulant,
   wherein the first surfaces of the inner lead portions are exposed in a common plane with the first surface of the encapsulant, and
   wherein a mounting surface of the outer lead portion of each of the leads is in a plane approximately parallel to, but slightly outward of, the second surface of the encapsulant.

2. The semiconductor package of claim 1, wherein the first surface of the die pad is exposed in the common plane with the first surface of the encapsulant.

3. The semiconductor package of claim 1, wherein the encapsulated side surfaces of the die pad and leads include a lip covered by the encapsulant.

4. The semiconductor package of claim 1, wherein the encapsulated side surfaces of the die pad and leads include a central concave region filled by the encapsulant.

5. The semiconductor package of claim 1, wherein the encapsulated side surfaces of the die pad and leads include a central projecting region that projects into the encapsulant.

6. The semiconductor package of claim 1, wherein the first surface of the inner lead portion of each of the leads includes a circular land.

7. The semiconductor package of claim 1, wherein a second semiconductor package is stacked on the semiconductor package over the first surface of the encapsulant, and is electrically coupled to the exposed first surface of the inner lead portion of at least some of the leads.

8. The semiconductor package of claim 7, wherein the second semiconductor package includes a plurality of solder balls each fused to the exposed first surface of the inner lead portion of a respective one of the leads of the semiconductor package.

9. The semiconductor package of claim 7, wherein the first surface of the die pad is exposed in the common plane with the first surface of the encapsulant, and
   wherein the second semiconductor package includes a metal leadframe including leads and a die pad embedded in an encapsulant, wherein a planar surface of at least some of the leads of the second semiconductor package are each exposed through and coplanar with a planar surface of the encapsulant and are electrically coupled by a conductive layer to the exposed first surface of the inner lead portion of respective ones of the leads of the semiconductor package.

10. The semiconductor package of claim 1, wherein an electronic device is electrically coupled to the exposed first surface of the inner lead portion of a plurality of the leads.

11. The semiconductor package of claim 1, wherein a passive device is electrically coupled to the exposed first surface of at least one of the inner lead portions.

12. The semiconductor package of claim 1, wherein the encapsulated side surfaces of the die pad includes a lip, and the inner lead portions include a recess extending said recess terminating at a recessed surface of the lead and being filled with the encapsulant.

13. A semiconductor package comprising:
   a hardened plastic encapsulant including an exterior planar first surface, an exterior planar second surface opposite and parallel to the first surface, and exterior peripheral side surfaces between the first and second surfaces;
   a plurality of metal leads each comprising a first surface and an opposite second surface, and peripheral side surfaces between the first and second surfaces;
   wherein a lengthwise inner lead portion of each of the leads is embedded in the encapsulant so that the first surface of the inner lead portion of the each of the leads is exposed at the first surface of the encapsulant but the second surface and peripheral side surfaces of the inner lead portion of each of the leads are within the encapsulant;

wherein a remaining outer lead portion of each of the leads extends outwardly from a respective one of the side surfaces of the encapsulant, the outer lead portion comprising a vertical portion that is approximately perpendicular to the inner lead portion and a foot portion that extends from the vertical portion outwards relative to the encapsulant; and wherein a portion of the second surface of the outer lead portion of each of the leads is in a plane approximately parallel to the second surface of the encapsulant; and a semiconductor die fully within the encapsulant and electrically coupled to the second surface of the inner lead portion of the leads.

14. The semiconductor package of claim 13, wherein the inner end portion of each of the leads includes a circular land.

15. The semiconductor package of claim 14, wherein the lands of at least some adjacent ones of the leads are staggered.

16. The semiconductor package of claim 14, wherein the lands are arranged in at least two rows.

17. The semiconductor package of claim 14, wherein the inner end portion of each of the leads includes a vertically acting means for locking the inner lead portion to the encapsulant.

18. The semiconductor package of claim 13, wherein the inner end portion of each of the leads includes a vertically acting means for locking the inner lead portion to the encapsulant and a horizontally acting means for locking the inner lead portion to the encapsulant.

19. The semiconductor package of claim 13, wherein the inner end portion of each of the leads includes a horizontally acting means for locking the inner lead portion to the encapsulant.

20. A semiconductor package comprising:
a hardened plastic encapsulant including an exterior planar first surface, an exterior planar second surface opposite and parallel to the first surface, and exterior peripheral side surfaces between the first and second surfaces;
a metal die pad and a plurality of metal leads, wherein the die pad and each of the metal leads comprise a first surface and an opposite second surface, and peripheral side surfaces between the first and second surfaces;

wherein at least the second surface and peripheral sides side surfaces of the die pad are embedded in the encapsulant;

wherein a lengthwise inner lead portion of each of the leads is embedded in the encapsulant so that the first surface of the inner lead portion of the each of the leads is exposed at the first surface of the encapsulant but the second surface and peripheral side surfaces of the inner lead portion of each of the leads are within the encapsulant;

wherein the inner end portion of each of the leads includes a horizontally acting means for locking the inner lead portion to the encapsulant;

wherein a remaining outer lead portion of each of the leads extends outwardly from a respective one of the side surfaces of the encapsulant, the outer lead portion comprising a vertical portion that is approximately perpendicular to the inner lead portion and a foot portion that extends from the vertical portion outwards relative to the encapsulant; and wherein a portion of the second surface of the outer lead portion of each of the leads is in a plane approximately parallel to the second surface of the encapsulant; and a semiconductor die mounted on the second surface of the die pad and electrically coupled to the second surface of the inner lead portion of the leads.

21. The semiconductor package of claim 20, wherein the horizontally acting means comprises a circular land.

22. The semiconductor package of claim 20, wherein the inner end portion of each of the leads includes a vertically acting means for locking the inner lead portion to the encapsulant.

23. The semiconductor package of claim 20, wherein the first surface of the die pad is exposed at the first surface of the encapsulant.

24. The semiconductor package of claim 23, wherein the die pad includes a vertically acting means for locking the die pad to the encapsulant.

* * * * *

UNITED STATES PATENT AND TRADEMARK OFFICE
CERTIFICATE OF CORRECTION

PATENT NO. : 6,977,431 B1
APPLICATION NO. : 10/702274
DATED : December 20, 2005
INVENTOR(S) : Kwang Seok Oh and Doo Hwan Moon It is certified that error appears in the above-identified patent and that said Letters Patent is hereby corrected as shown below:

In Claim 12, at Column 12, Line 51, after "recess extending", insert --into the lead from the first surface of the inner lead portion,--.

In Claim 20, at Column 14, Line 3, delete "sides".

Signed and Sealed this

First Day of August, 2006

JON W. DUDAS
*Director of the United States Patent and Trademark Office*